United States Patent [19]
Kubota

[11] Patent Number: 5,191,550
[45] Date of Patent: Mar. 2, 1993

[54] DUAL ANTIFUSE MEMORY DEVICE

[75] Inventor: Hideko Kubota, Suwa, Japan

[73] Assignee: Seiko Epson Corporation, Japan

[21] Appl. No.: 621,297

[22] Filed: Nov. 30, 1990

[30] Foreign Application Priority Data

| Nov. 30, 1989 | [JP] | Japan | 1-310904 |
| Dec. 18, 1989 | [JP] | Japan | 1-327601 |
| Jan. 11, 1990 | [JP] | Japan | 2-4181 |
| Jan. 11, 1990 | [JP] | Japan | 2-4182 |

[51] Int. Cl.⁵ .............................................. G11C 13/00
[52] U.S. Cl. ..................................... 365/96; 365/94; 365/175
[58] Field of Search ............... 365/94, 96, 175, 149, 365/189.01

[56] References Cited

U.S. PATENT DOCUMENTS

| Re. 33,261 | 7/1990 | Baglee et al. | 365/149 |
| 4,569,121 | 2/1986 | Lim et al. | 29/574 |
| 4,605,872 | 8/1986 | Rung | 307/465 |
| 4,748,490 | 5/1988 | Hollingsworth | 357/51 |
| 4,914,055 | 4/1990 | Gordon et al. | 437/192 |

Primary Examiner—Terrell W. Fears
Attorney, Agent, or Firm—W. Douglas Carothers, Jr.

[57] ABSTRACT

A semiconductor memory device employing a plurality of antifuse memory elements is disclosed. The memory elements have selected connection portions of two or more elements formed as a unit and are otherwise electrically connected for use without regard to the polarity of the applied voltage. Such two-way antifuse memory elements formed in parallel become a unit thereby reducing occupied area and enhancing device integration.

11 Claims, 6 Drawing Sheets

DUAL ANTIFUSE MEMORY DEVICE

BACKGROUND OF THE INVENTION

This invention relates generally to semiconductor memory devices and, particularly, to antifuse structures which decrease resistance by applying a voltage above a prescribed threshold value.

Referring to FIGS. 11 and 12, antifuses of the prior art, as disclosed for example in Hollingsworth, U.S. Pat. No. 4,748,490 and Gordon et al., U.S. Pat. No. 4,914,055, the disclosures of which are hereby incorporated by reference, are produced by applying polycrystalline silicon layer 3 having a high concentration of conductive impurity on oxide film 2a formed on semiconductor substrate 1. Layer 3 is covered with protective insulator film 2b having opposing openings a, b. A semi-insulating amorphous silicon layer 4 is applied in opening a. Metal barrier layer 5a is sandwiched between layer 4 and aluminum electrode 6a. Metal barrier layer 5b is applied directly in opening b and aluminum electrode 6b is positioned on layer 5b.

When a program voltage, i.e. a voltage greater than a prescribed threshold value, is applied between electrodes 6a and 6b, dielectric breakdown occurs in layer 4. A portion of layer 3 fuses along the breakdown path. As a result, electrical resistance of the fuse is reduced where dielectric breakdown has occurred, thus forming a conductive path having a prescribed conductivity within a low voltage range.

Referring to FIG. 9, in prior art antifuses dielectric breakdown voltage, indicated by a dot (•), depends on the polarity of the applied voltage as depicted by the illustrated I-V characteristic. Since program voltage and resistance following programming depend on the polarity of the antifuse when installed in the semiconductor memory device, the antifuse cannot be reliably programmed without attention inconveniently directed to such initial polarity. As a result, the antifuse can not be conveniently used bi-directionally.

The present invention solves these and other problems of prior art antifuses by providing a bi-directional antifuse which eliminates or reduces aberrations resulting from the alternative directionality of the program voltage.

SUMMARY OF THE INVENTION

The semiconductor memory device of the present invention comprises a plurality of antifuse memory elements each having a conductive layer containing a high concentration of impurity. First and second connection portions are formed on the conductive layer. A first electrode is formed on the first connection portion with a high resistance layer sandwiched between them. A second electrode is formed directly onto the second connection portion. First and second electrode wiring means transmit a voltage between the first and second connection portions. Where first and second antifuse memory elements are employed, the first connection portion in the first antifuse memory element and the second connection portion in the second antifuse memory element are connected to the first electrode wiring and the second connection portion in the first antifuse memory element and the first connection portion in the second antifuse memory element are connected to the second electrode wiring.

In an alternative embodiment of the present invention the conductive layer in the first antifuse memory element is a first conductive semiconductor layer, the conductive layer in the second antifuse memory element is a second conductive semiconductor layer. The first electrodes in the first and second antifuse memory elements are connected to the first electrode wiring means. The second electrodes in the first and second antifuse memory elements are connected to the second electrode wiring means.

The first connection portion in the first antifuse memory element and the first connection portion in the second antifuse memory element may be formed as a unitary structure. Similarly, the second connection portion in the first antifuse memory element and the second connection portion in the second antifuse memory element may be formed as a unitary structure.

The high resistance layer may be formed from amorphous silicon. A metal barrier layer may be formed between the first and second connection portions and the first and second electrode wirings. Since the first and second connection portions of the first and second memory elements are oppositely connected with respect to the first electrode wiring and the second electrode wiring, the voltage applied to the first memory element and the voltage applied to the second memory element are opposite regardless of the polarity of the voltage applied across the first and second electrode wirings. Therefore, even if the dielectric breakdown voltage of the high resistance layer should depend on the polarity of the program voltage applied between the first and second connection portions, according to the teaching of the present invention, dielectric breakdown voltage is obtained in the direction in which the voltage is lower in one of the antifuse memory elements. Irregardless of the polarity of the voltage applied, a dielectric breakdown voltage is obtained in the direction of lower voltage. As a result, bi-directional antifuses can be employed without regard to direction of connection and resistance aberration following dielectric breakdown is suppressed.

In a second exemplary embodiment, the first antifuse memory element formed on the first conductive semiconductor layer and the second antifuse memory element formed on the second conductive semiconductor layer are connected in parallel between the first and second electrode wirings. The relative value of the dielectric breakdown voltage with respect to applied voltage polarity between the first and second connection portions is reversed in the high resistance layer on the first conductive semiconductor layer and the high resistance layer on the second conductive semiconductor layer. Regardless of the direction in which voltage is applied between the first and second electrode wirings, the dielectric breakdown voltage is obtained in the direction in which voltage is lower in one memory device. Here, the difference between the dielectric breakdown voltage in the direction in which voltage is lower in the first antifuse memory element and the dielectric breakdown voltage in the direction in which the voltage is lower in the second antifuse element is much smaller than the difference between the dielectric breakdown voltages due to the direction of the applied voltage in either of the antifuse memory elements. The resulting difference in program voltages from the application of a positive or negative voltage between first and second electrode wirings is much smaller than that of a single memory element.

When the first connection portion or second connection portion in the first memory element and the first connection portion or second connection portion in the second memory element are formed as a unit, the resulting two-way antifuse memory elements formed in parallel become a unit so the area occupied can be reduced.

Other objects and attainments together with a fuller understanding of the invention will become apparent and appreciated by referring to the following description and claims taken in conjunction with the accompanying drawings.

DESCRIPTION OF THE INVENTION

Figure 1:
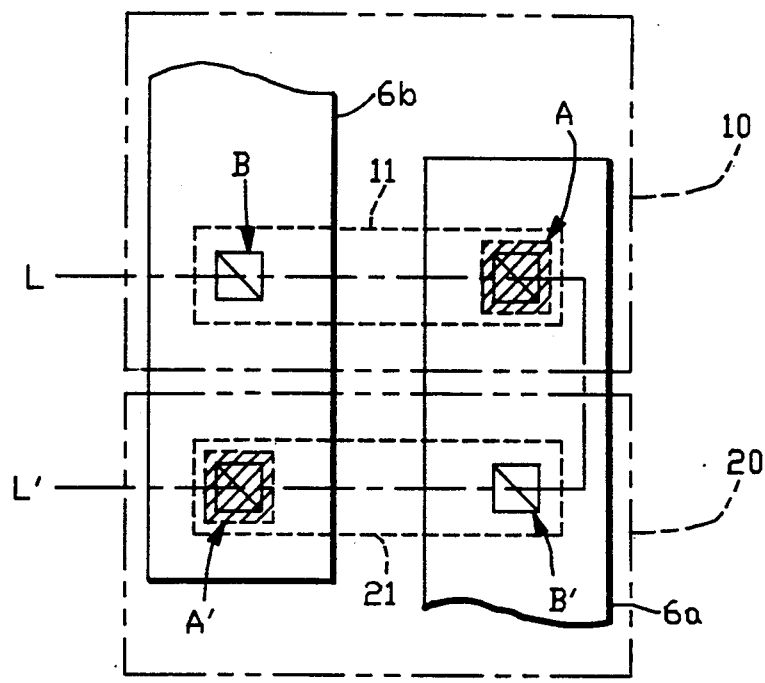
FIG. 1 is a top view of one embodiment of the antifuse memory device of this invention.
Figure 2:
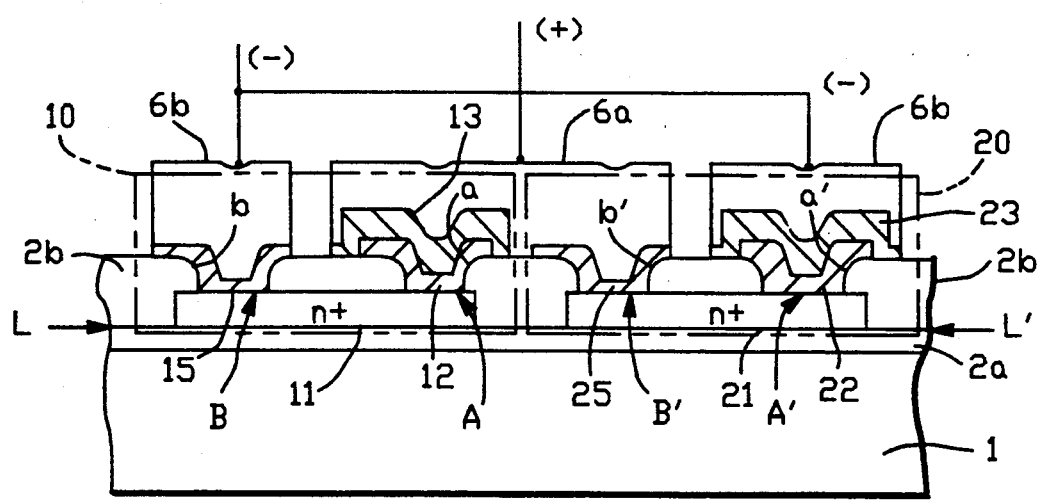
FIG. 2 is an end cross section along line L—L' of FIG. 1.

Referring to FIGS. 1 and 2, conductive parallel polycrystalline silicon layers 11, 21 are formed onto an oxide film layer 2a on semiconductor substrate 1. The polycrystalline silicon layers are applied to film 2a employing a conventional CVD process and are patterned following diffusion with a high concentration of phosphorous (P). Layers 11, 21 are then covered with oxide film 2b. Openings a, b are formed in film 2b of highly conductive polycrystalline silicon layer 11. Similarly, openings a' and b' are formed in film 2b of highly conductive polycrystalline silicon layer 21. Employing a CVD technique, amorphous silicon layers 12, 22 are formed to a thickness of about 1500 Å in openings a, a'. Then, two-layer metal barrier layers 13, 23 are formed on layers 12, 22, respectively, by sputtering to form first connection portions A, A'. Metal barrier layers 15, 25 are applied directly to openings b and b' to form second connection portions B, B'. In this manner, antifuse memory elements 10, 20 are formed. First connection portion A in antifuse memory element 10 and second connection portion B' in antifuse memory element 20 are connected to aluminum electrode wiring 6a. Second connection portion B' in antifuse memory element 10 and first connection portion A in antifuse memory element 20 are connected to aluminum electrode wiring 6b.

In the embodiment of FIGS. 1 and 2, when a voltage is applied between aluminum electrodes 6a, 6b so that, for example, aluminum electrode 6a is at high potential, a positive voltage is applied across layer 12 relative to n+ type polycrystalline silicon layer 11 in first connection portion A of antifuse memory element 10, while in first connection portion A' of antifuse memory element 20, a negative voltage is applied across layer 22 relative to n+ type polycrystalline silicon layer 21. In this manner, the directions of voltages in first connection portions A, A' are always opposite regardless of the polarity of the applied voltage at electrodes 6a and 6b.

Figure 10:
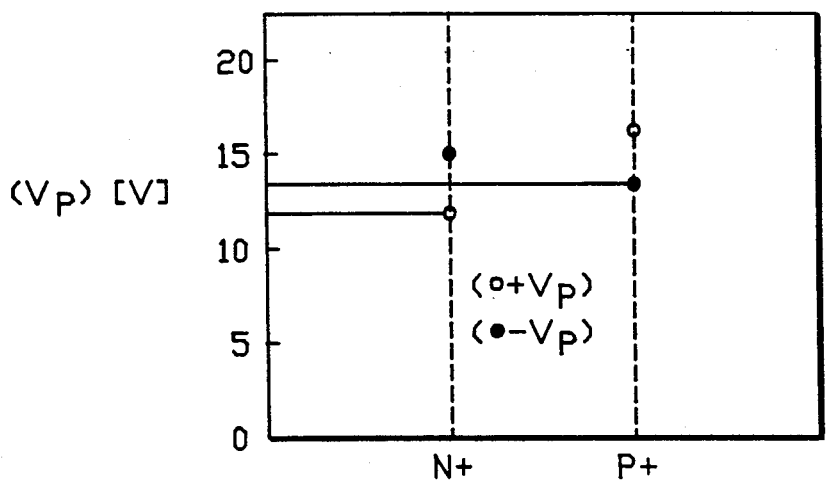
FIG. 10 is a graph showing the program voltage on the n+ type diffusion layer and on the p+ type diffusion layer.
Figure 11:
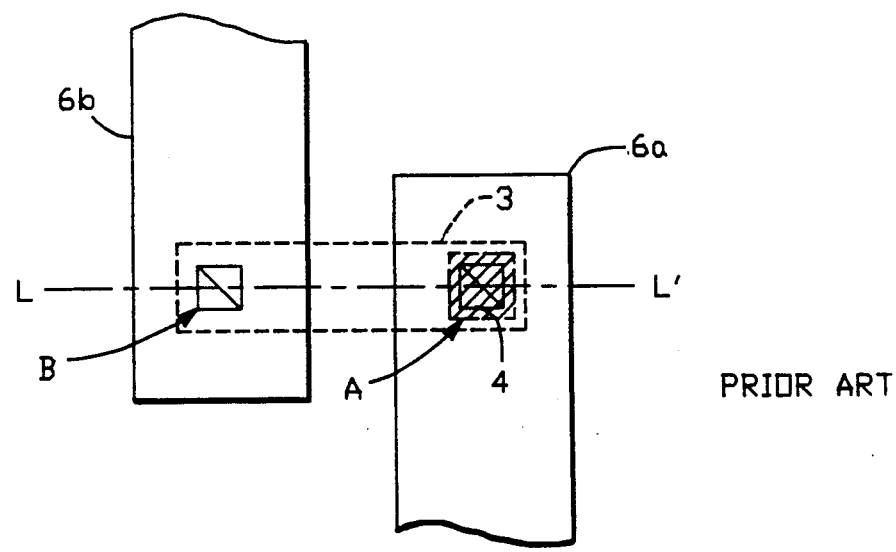
FIG. 11 is a top view of an antifuse memory device of the prior art.
Figure 12:
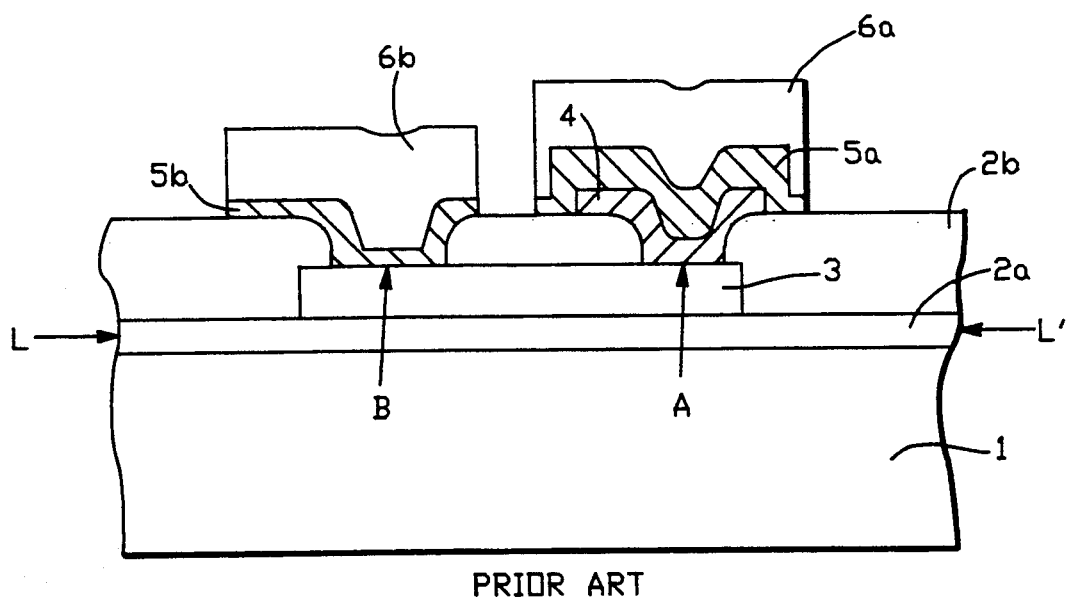
FIG. 12 is an end cross section along line L—L' of FIG. 11.

As shown in FIG. 10, when a donor impurity is diffused in the polycrystalline silicon layer, dielectric breakdown voltage of the amorphous silicon layer, i.e. the program voltage $+V_P$, corresponding to the voltage applied across layer 12 relative to layer 21 is about 10 to 11 V. Program voltage $-V_P$, corresponding to the voltage applied in the opposite direction, is about 13 to 14 V. Thus, in the case of a single antifuse memory element, such as shown in FIG. 12, there is a difference in the program voltage depending on the direction of the applied voltage, while in the case of this embodiment, directions of the applied voltages in antifuse memory element 10 and antifuse memory element 20 are opposite. Therefore, regardless of polarity of the applied voltage, dielectric breakdown occurs in layers 12 or 22 at program voltage $-V_P$ in one of the memory elements, so that conductivity in portion A or A' is increased and programming is achieved.

In this embodiment, program voltage remains equal even when the direction of polarity of the applied voltage is changed so that antifuse memory elements can be used without regard to polarity, and resistance aberrations following programming are reduced. Moreover, a low program voltage $V_P$ unrelated to the direction of the applied voltage is obtained, so when the elements are employed in mask ROMs and other types of semiconductor devices, it is unnecessary to set a high breakdown voltage for the antifuse memory elements in such devices.

Alternatively, p+ type diffusion can be employed in polycrystalline silicon layers 11, 21. Destructed crystalline silicon or other types of semi-insulating layers may be substituted for amorphous silicon layers 12, 22.

Figure 3:
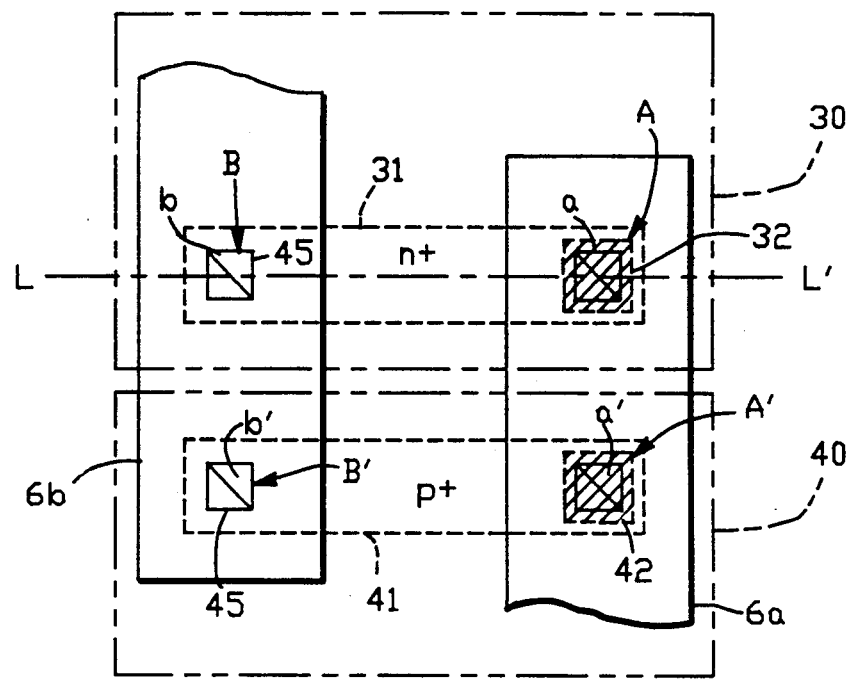
FIG. 3 is a top view of an alternative embodiment of an antifuse memory device according to the present invention.
Figure 4:
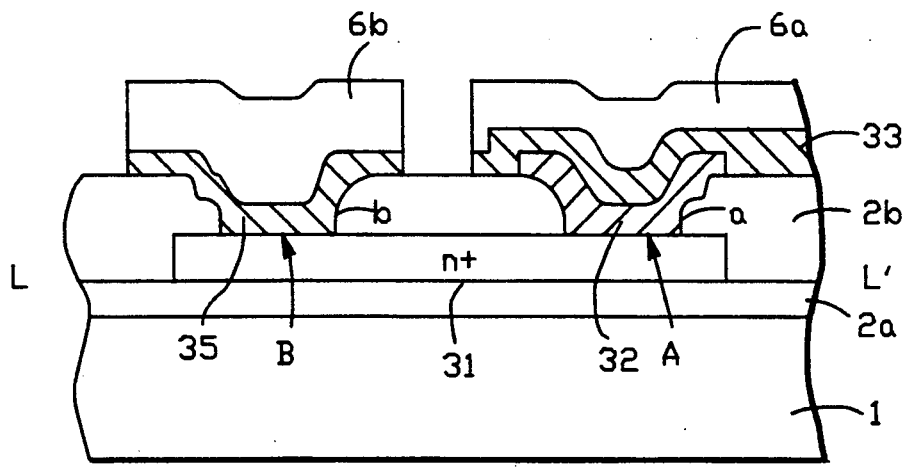
FIG. 4 is an end cross section taken along line L—L' of FIG. 3.

Referring now to the exemplary embodiment of FIGS. 3 and 4, polycrystalline silicon layers 31, 41 are formed on oxide film 2a of substrate 1. Phosphorous is diffused in layer 31 and boron is diffused in layer 41, whereby layer 31 becomes n+ type and layer 41 becomes p+ type.

Oxide film 2b is formed on layers 31, 41 and includes openings a, b formed in oxide film 2b on layer 31 and openings a', b' formed in oxide film 2b on layer 41. Amorphous silicon layers 32, 42 are formed on openings a, a'. Metal barrier layers 33, 43 are formed on layers 32, 42, respectively, to complete first connection portions A, A'. Metal barrier layers 35, 45 are applied directly to openings b, b' to complete second connection portions B, B'. Aluminum electrode wiring 6a is connected to first connection portions A, A', and aluminum electrode wiring 6b is connected to second connection portions B, B'.

In this embodiment, memory element 30 comprising n+ type polycrystalline silicon layer 31, first connection portion A and second connection portion B, and antifuse memory element 40 comprising p+ type polycrystalline silicon layer 41, first connection portion A' and second connection portion B' are connected in the same direction in parallel between aluminum electrode wiring 6a, 6b. Therefore, voltage is applied to memory elements 30, 40 in the same direction. However, as shown in FIG. 10, program voltage $+V_P$ in the antifuse memory element with an n+ type polycrystalline silicon layer is lower than $-V_P$, while the program voltage $-V_P$ in the antifuse memory element with a p+ type polycrystalline silicon layer 41 is lower than $+V_P$. As a result, there is almost no difference between program voltage $+V_P$ in antifuse memory element 30 and program voltage $-V_P$ in antifuse memory element 40. In this embodiment, when aluminum electrode wiring 6a is at high potential, dielectric breakdown of layer 32 occurs at program voltage $+V_P$ of antifuse memory element 30. When aluminum electrode wiring 6b is at high potential, dielectric breakdown of layer 42 occurs at program voltage $-V_P$ of antifuse memory element 40. Therefore, whichever direction the voltage is applied, programming is completed by either program voltage $+V_P$ of antifuse memory element 30 or program voltage $-V_P$ of antifuse memory element 40. The difference in program voltage depending on polarity is smaller for such a double memory element compared to that for a single memory element.

Figure 5:
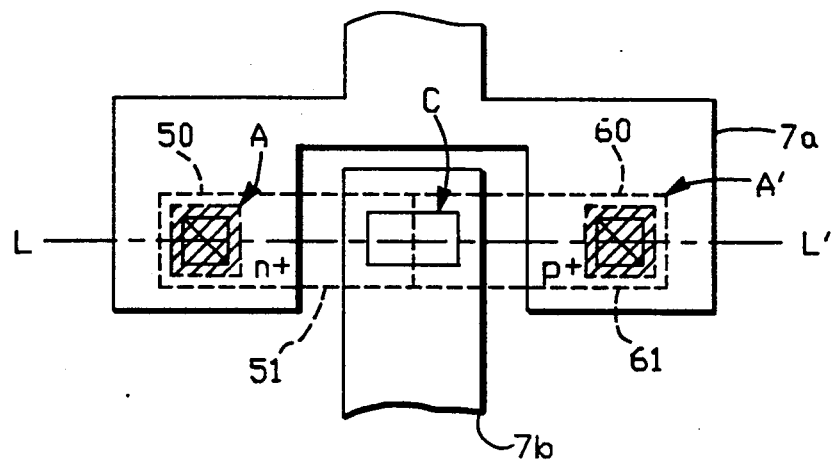
FIG. 5 is a top view of an alternative embodiment of an antifuse memory device of the present invention.
Figure 6:
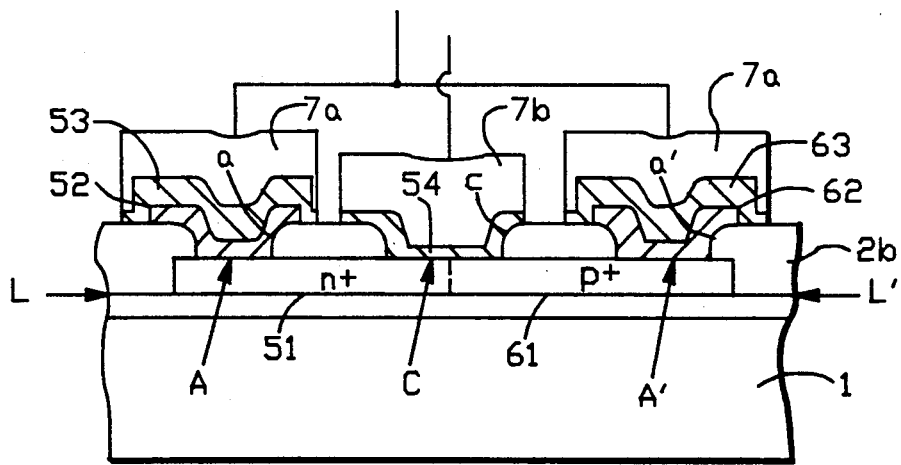
FIG. 6 is an end cross section taken along line L—L' of FIG. 5.

Referring to FIGS. 5 and 6, a still further embodiment of the present invention formed with antifuse memory elements 50, 60 in contact is shown. Polycrystalline silicon layer 51 is diffused with n+ type phosphorous doping and polycrystalline silicon layer 61 is diffused with p+ type boron doping. First connection portion A is formed over layer 51 by providing opening, a, in oxide film 2b and sequentially depositing amorphous silicon layer 52 and metal barrier layer 53. First connection portion A' is formed over polycrystalline silicon layer 61 by providing opening, a', in oxide film 2b and depositing amorphous silicon layer 62 and metal barrier layer 63. Opening, c, overlaps the contact surface between layers 51, 61. Metal barrier layer 54 is formed onto opening, c, to form second connection portion C. Aluminum electrode wiring 7a, 7a is connected to first connection portions A, A' and aluminum electrode wiring 7b is connected to second connection portion C.

In this embodiment memory elements 50, 60 are formed on opposite layers 51, 61 and are connected in parallel between wirings 7a, 7b. Also in this embodiment, second connection portions C in antifuse memory elements 50, 60 are formed as a single unit, so the area occupied by the elements is reduced, thus providing for increased integration of the semiconductor device.

Figure 7:
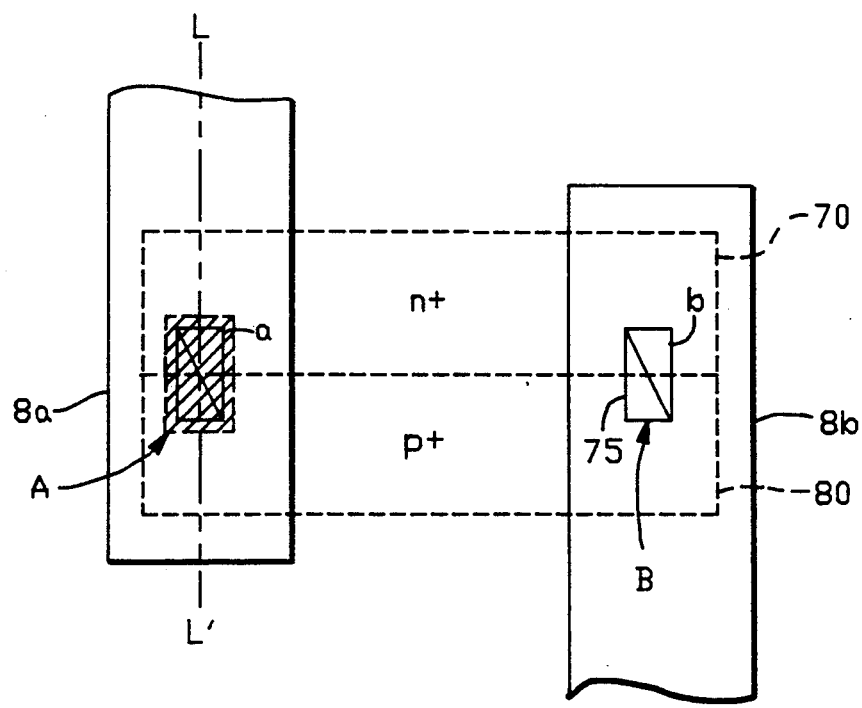
FIG. 7 is a top view of an alternative embodiment of the antifuse memory device of the present invention.
Figure 8:
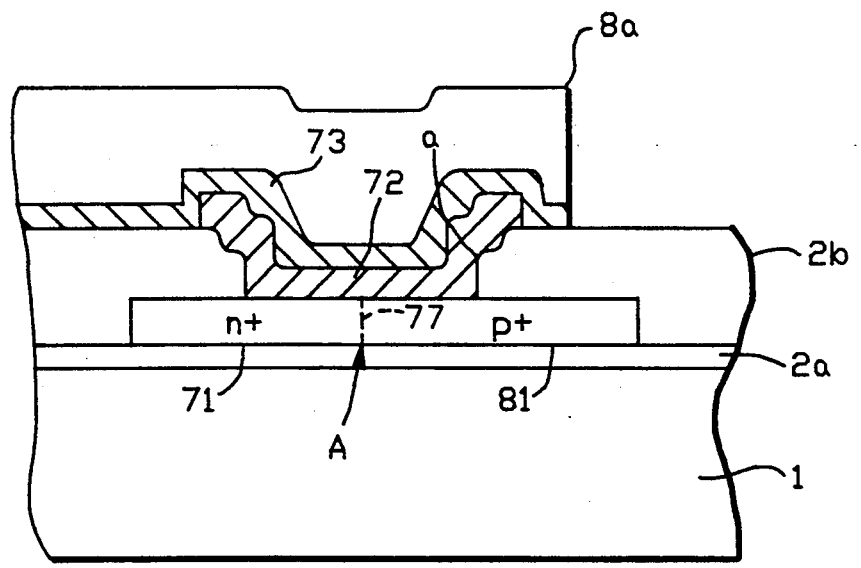
FIG. 8 is an end cross section taken along line L—L' of FIG. 7.
Figure 9:
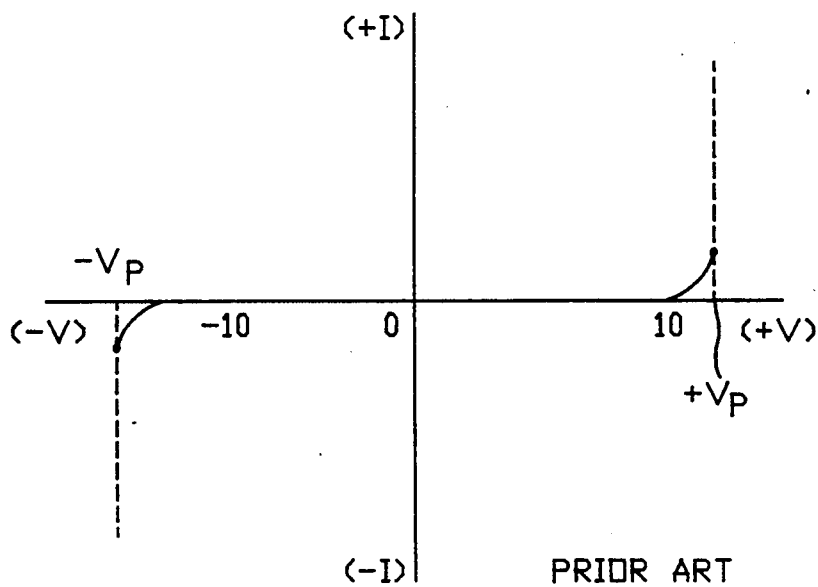
FIG. 9 is a graph showing the current-voltage characteristic of antifuse memory devices of the prior art.

In the embodiment of FIGS. 7 and 8, antifuse memory elements 70, 80 comprise adjacently formed n+ type polycrystalline silicon layer 71 and p+ type polycrystalline silicon layer 81 on oxide film 2a. Adjoining side surfaces of layers 71, 81 form interface 77 and openings a, b are formed in oxide film 2b above interface 77. Amorphous silicon layer 72 and metal barrier layer 73 are deposited above opening, a, to form first connection portion A. Aluminum electrode wiring 8a is connected onto portion A. Metal barrier layer 75 is applied directly above opening b to form second connection portion B. Aluminum electrode wiring 8b is connected onto portion B. Antifuse memory element 70 is positioned on n+ type polycrystalline silicon layer 71 and antifuse memory element 80 is positioned on p+ type polycrystalline silicon layer 81. In this embodiment first connection portions A in antifuse memory elements 70, 80 are formed as a single unit and second connection portions B have identical structure in both elements. Therefore, the area occupied by the element can be further decreased thereby achieving higher device integration.

In the foregoing exemplary embodiments of the present invention, two antifuse memory elements are employed for a memory device, however, three or more antifuse memory elements can be combined to realize a memory device with the desired bi-directional characteristic. Similarly, amorphous silicon was formed employing a CVD technique. Sputtering may also be employed for such deposition. Also, following deposition of the polycrystalline silicon film, the crystal structure may be destroyed by argon ion implantation. The metal barrier layers described herein are preferably formed of titanium (Ti) or titanium nitride (TiN).

As described herein, the present invention provides a structure which eliminates dependency of dielectric breakdown voltage on polarity of the applied voltage by connecting two or more antifuse memory elements with opposite characteristics. Since the elements have equal or nearly equal program voltages, even if the direction of the applied voltage is changed, the elements can be employed in a circuit implementation without regard to connection polarity and thereby rendering them more convenient to use and reducing resistance aberrations following programming. When the first or second connection portions are formed as a dual unit, the area occupied by the antifuse memory elements can be reduced so as to increase the level of integration of the memory device.

While the invention has been described in conjunction with several specific embodiments, it is evident to those skilled in the art that many further alternatives, modifications and variations will be apparent in light of the forgoing description. Thus, the invention described herein is intended to embrace all such alternatives, modifications, applications and variations as may fall within the spirit and scope of the appended claims.

What is claimed is:

1. A semiconductor memory device comprising:
 a first antifuse memory element having a first conductive layer;
 a second antifuse memory element having a second conductive layer;
 said first and second conductive layers each having electrically identical type doping;
 said first and second conductive layers each having a surface with a first connection portion and a second connection portion;
 first electrodes each separated from a respective one of said first connection portions by a high resistance layer;
 second electrodes each formed directly to a respective one of said second connection portions; and
 means for applying a voltage between said first and second connection portions of each of said memory elements;
 said first connection portion of said first memory element and said second connection portion of said second memory element electrically connected to said first electrode of said first memory element;
 said second connection portion of said first memory element and said first connection portion of said second memory element electrically connected to said second electrode of said second memory element.

2. The device of claim 1 wherein said first and second conductive layers contain a high concentration of impurity.

3. The semiconductor memory device of claim 1 wherein said high resistance layer is formed from destroyed-crystalline silicon or amorphous silicon.

4. A semiconductor memory device comprising:
a first antifuse memory element having a first conductive layer;
a second antifuse memory element having a second conductive layer;
said first and second conductive layers having electrically opposite type doping;
said first and second conductive layers each having a surface with a first connection portion and a second connection portion;
first electrodes each separated from a respective one of said first connection portions by a high resistance layer;
second electrodes each formed directly to a respective one of said second connection portions; and
means for applying a voltage between said first and second connection portions of each of said memory elements;
said first connection portion of said first memory element and said first connection portion of said second memory element are electrically connected to said first electrode of said first memory element;
said second connection portion of said first memory element and said second connection portion of said second memory element are electrically connected to said second electrode of said second memory element.

5. A semiconductor memory device comprising:
a first antifuse memory element having a first conductive layer;
a second antifuse memory element having a second conductive layer;
said first and second conductive layers having electrically opposite type doping;
said first and second conductive layers each having a surface with a first connection portion and a second connection portion;
first electrodes each separated from a respective one of said first connection portions by a high resistance layer;
a second electrode electrically joined to said second connection portions; and
means for applying a voltage between said first and second connection portions of each of said memory elements;
said first connection portion of said first memory element and said first connection portion of said second memory element are electrically connected to said first electrode of said first memory element;
said second connection portion of said first memory element and said second connection portion of said second memory element are integrally formed.

6. A semiconductor memory device comprising:
a first antifuse memory element having a first conductive layer;
a second antifuse memory element having a second conductive layer;
said first and second conductive layers having electrically opposite type doping;
said first and second conductive layers each having a surface with a first connection portion and a second connection portion;
a first electrode separated from said first connection portions by a high resistance layer;
a second electrode electrically joined to said second connection portions; and
means for applying a voltage between said first and second connection portions of each of said memory elements;
said first connection portion of said first memory element and said first connection portion of said second memory element are integrally formed and electrically joined to said first electrode of said first memory element;
said second connection portion of said first memory element and said second connection portion of said second memory element are integrally formed.

7. A semiconductor memory device comprising:
a plurality of antifuse memory elements each having a conductive semiconductor layer containing a high concentration of impurity;
one or more first connection portions and one or more second connection portions formed on each one of said conductive layers;
each of said first connection portions being separated from a first electrode by a high resistance layer;
each one of said second connection portions being directly formed to a second electrode; and
each one of said memory elements having first and second electrode wiring for applying a prescribed voltage between said first and second connection portions, respectively; and
wherein at least one pair of said memory elements include a first memory element having a first electrode electrically connected to the first electrode wiring of a second memory element which has a second electrode electrically connected to the second electrode wiring of said first memory element.

8. The semiconductor memory device of claim 7 wherein said first connection portions of said pair of memory elements are formed as a unit.

9. The semiconductor memory device of claim 7 wherein the high resistance layer is formed from destroyed-crystalline silicon or amorphous silicon.

10. The semiconductor memory device of claim 7, wherein said second connection portion of said first memory element and said second connection portion of said second antifuse memory element are integrally formed.

11. A method of programming a semiconductor memory device comprising at least two antifuse memory elements, each of said elements including first and second connection means formed on a conductive base, said first connection means including a high resistance layer formed on said conductive base whereby a conductive path may be formed through said first connection means, through said base to said second connection means, and comprising the steps of:
electrically connecting the first connection portion in said first antifuse memory element and the second connection portion in said second antifuse memory element forming a first terminal;
electrically connecting the second connection portion in said first antifuse memory element and the first connection portion in said second antifuse memory element forming a second terminal;
applying a programing voltage of a first polarity to said first terminal while concurrently apply a programing voltage of a second polarity to said second terminal wherein said voltages are substantially of the same magnitude relative to said high resistance layers, whereby a breakdown voltage is produced across said high resistance layers with the minimum programed voltage magnitude to establish a desired resistance value for said device whereby subsequential residual deviation from said established resistance value is minimized.

* * * * *